United States Patent
Ko et al.

(10) Patent No.: US 11,538,883 B2
(45) Date of Patent: Dec. 27, 2022

(54) OLED DISPLAY PANEL AND OLED DEVICE WITH WIRE OVERLYING STEP IN VIA-HOLES, AND MANUFACTURING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Young Yik Ko, Beijing (CN); Xiangdan Dong, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 1001 days.

(21) Appl. No.: 16/322,826

(22) PCT Filed: Jun. 6, 2018

(86) PCT No.: PCT/CN2018/090093
§ 371 (c)(1),
(2) Date: Feb. 1, 2019

(87) PCT Pub. No.: WO2019/041941
PCT Pub. Date: Mar. 7, 2019

(65) Prior Publication Data
US 2021/0376034 A1     Dec. 2, 2021

(30) Foreign Application Priority Data

Sep. 4, 2017 (CN) .......................... 201710785779.6

(51) Int. Cl.
*H01L 27/32* (2006.01)
*H01L 23/00* (2006.01)
(Continued)

(52) U.S. Cl.
CPC .......... *H01L 27/3276* (2013.01); *H01L 24/29* (2013.01); *H01L 27/3246* (2013.01);
(Continued)

(58) Field of Classification Search
CPC ............. H01L 27/3276; H01L 27/3246; H01L 27/3258; H01L 24/29; H01L 24/32;
(Continued)

(56) References Cited

U.S. PATENT DOCUMENTS 9,923,167 B2 * 3/2018 Choi .................. H01L 51/5253
2016/0372489 A1   12/2016 Li et al.
(Continued)

FOREIGN PATENT DOCUMENTS

CN      104538407 A      4/2015
CN      104716156 A      6/2015
(Continued)

OTHER PUBLICATIONS

International Search Report and Written Opinion dated Sep. 10, 2018; PCT/CN2018/090093.

*Primary Examiner* — Lex H Malsawma (57) ABSTRACT

An OLED display panel and a manufacturing method thereof, and an OLED display device are disclosed. The OLED display panel includes a base substrate; a first film layer and a second film layer, sequentially provided on the base substrate, a first via-hole penetrating through the first film layer being provided in the first film layer, a second via-hole penetrating through the second film layer being provided in the second film layer at a position corresponding to the first via-hole, the second via-hole being in commu-
(Continued)

nication with the first via-hole, and the first film layer and the second film layer form a first step at a position of the second via-hole; and a connection wire, provided in both the first via-hole and the second via-hole and overlying the first step.

18 Claims, 4 Drawing Sheets

(51) Int. Cl.
 *H01L 51/00* (2006.01)
 *H01L 51/56* (2006.01)
(52) U.S. Cl.
 CPC ...... *H01L 27/3258* (2013.01); *H01L 51/0097* (2013.01); *H01L 51/56* (2013.01); *H01L 24/32* (2013.01); *H01L 2224/29009* (2013.01); *H01L 2224/29022* (2013.01); *H01L 2224/32225* (2013.01); *H01L 2227/323* (2013.01); *H01L 2251/5338* (2013.01)
(58) Field of Classification Search
 CPC ................. H01L 51/0097; H01L 51/56; H01L 2224/29009; H01L 2224/29022; H01L 2227/323; H01L 2251/5338
 See application file for complete search history.

(56) References Cited

U.S. PATENT DOCUMENTS

| | | |
|---|---|---|
| 2017/0133594 A1 | 5/2017 | Mimura et al. |
| 2017/0170206 A1* | 6/2017 | Lee .................. H01L 29/78633 |
| 2017/0237025 A1* | 8/2017 | Choi .................. H01L 51/5256 257/40 |
| 2018/0033832 A1* | 2/2018 | Park ...................... G06F 3/0446 |
| 2018/0102399 A1* | 4/2018 | Cho ...................... H01L 27/3258 |
| 2018/0120620 A1* | 5/2018 | Shim ................ H01L 27/14636 |
| 2018/0342707 A1* | 11/2018 | Lee ...................... H01L 51/5253 |

FOREIGN PATENT DOCUMENTS

| | | |
|---|---|---|
| CN | 104904327 A | 9/2015 |
| CN | 107331694 A | 11/2017 |
| CN | 207124195 U | 3/2018 |
| EP | 3300466 A1 | 3/2018 |
| JP | 2017-091693 A | 5/2017 |

\* cited by examiner

OLED DISPLAY PANEL AND OLED DEVICE WITH WIRE OVERLYING STEP IN VIA-HOLES, AND MANUFACTURING METHOD THEREOF

CROSS REFERENCE TO RELATED APPLICATIONS

The application claims priority to Chinese patent application No. 201710785779.6 filed on Sep. 4, 2017, the entire disclosure of which is incorporated herein by reference as part of the present application.

TECHNICAL FIELD

Embodiments of the present disclosure relates to an OLED display panel and a manufacturing method thereof, and an OLED display device.

BACKGROUND

By bonding an OLED (organic light emitting diode) display panel to a FPC (flexible printed circuit), the OLED display panel connects to a PCB (printed circuit board), and therefore connects to a mainboard.

Bonding the OLED display panel to the FPC may be realized through the following processes: before forming a source-drain pattern, forming a via-hole penetrating through an insulation layer at the periphery area of the OLED display panel; and then forming a source-drain electrode layer to overlay the via-hole; next, sequentially forming a planarization layer, a pixel define layer, a spacer layer, and exposing the source-drain electrode layer, forming a connection wire in a via-hole region, and allowing the connection wire to electrically connect the source-drain electrode layer and to electrically connect the IC (integrated circuit) of the FPC.

However, the planarization layer, the pixel define layer and the spacer layer are relatively smooth in the via-hole region, and therefore the connection wire cannot firmly adhere to the via-hole region, the connection wire is subject to fall off, which results in the bonding defect between the OLED display panel and the FPC.

SUMMARY

The embodiments of the present disclosure provide an OLED display panel and a manufacturing method thereof, and an OLED display device, which can be at least partially used to solve the problem that the connection wire for bonding the OLED display panel and FPC is easy to fall off.

According a first aspect of the present disclosure, an OLED display panel is provided and the OLED display panel comprises a base substrate, a first film layer and a second film layer, sequentially provided on the base substrate, a first via-hole penetrating through the first film layer being provided in the first film layer, a second via-hole penetrating through the second film layer being provided in the second film layer at a position corresponding to the first via-hole, the second via-hole being in communication with the first via-hole, and the first film layer and the second film layer form a first step at a position of the second via-hole; and a connection wore, provided in both the first via-hole and the second via-hole and overlying the first step.

According a second aspect of the present disclosure, an OLED display device is provided, and the OLED display device includes the above-mentioned OLED display panel.

According a third aspect of the present disclosure, a method for manufacturing an OLED display panel is provided, and the method comprises: forming a first film layer on a base substrate, and forming a first via-hole penetrating through the first film layer; forming a second film layer on the first film layer, and forming a second via-hole penetrating through the second film layer at a position of the second film layer corresponding to the first via-hole, the second via-hole being in communication with the first via-hole, the second film layer and the first film layer forming a first step at a position of the second via-hole; and forming a connection wire at a position corresponding to the second via-hole and the first via-hole, the connection wire being in both the first via-hole and the second via-hole and overlying the first step.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An embodiment of the present disclosure provides an OLEO display panel, comprising: a base substrate, a first film layer and a second film layer, sequentially provided on the base substrate, a first via-hole penetrating through the first film layer being provided hi the first film layer, a second via-hole penetrating through the second film layer being provided hi the second film layer at a position corresponding to the first via-hole, the second via-hole being in communication with the first via-hole, and the first film layer and the second film layer form a first step at a position of the second via-hole; and a connection wire, provided in both the first via-hole and the second via-hole and overlying the first step.

For example, the first film layer is an insulation layer, the second film layer is an planarization layer, the OLEO display panel further comprises: a source-drain electrode layer between the insulation layer and the planarization layer, the source-drain electrode layer overlays the first via-hole, the planarization layer and the source-drain electrode layer form the first step at a position of the second via-hole.

As illustrated in FIG. 1 and FIG. 2a to FIG. 2c, an embodiment of the present disclosure provides an OLED display panel, and the OLED display panel includes: a base substrate 1, a connection wire 5, and an insulation layer 2, a source-drain electrode layer 3 and a planarization layer (PLN) 4 which are sequentially provided on the base substrate 1. A first via-hole 6 penetrating through the insulation layer 2 is provided in the insulation layer 2, the source-drain electrode layer 3 overlays the first via-hole 6, and the connection wire 5 is provided in the first via-hole 6. A second via-hole 7 penetrating through the planarization layer 4 is provided in the planarization layer 4 at the position corresponding to the first via-hole 6, and the second via-hole 7 is in communication with the first via-hole 6. A first step 41 made up of the planarization layer 4 and the source-drain electrode layer 3 is formed at the position of the second via-hole 7, that is, the planarization layer 4 partially overlays a region of the source-drain electrode layer 3 having no via-holes, and the connection wire 5 overlays the first step 41.

Figure 1:
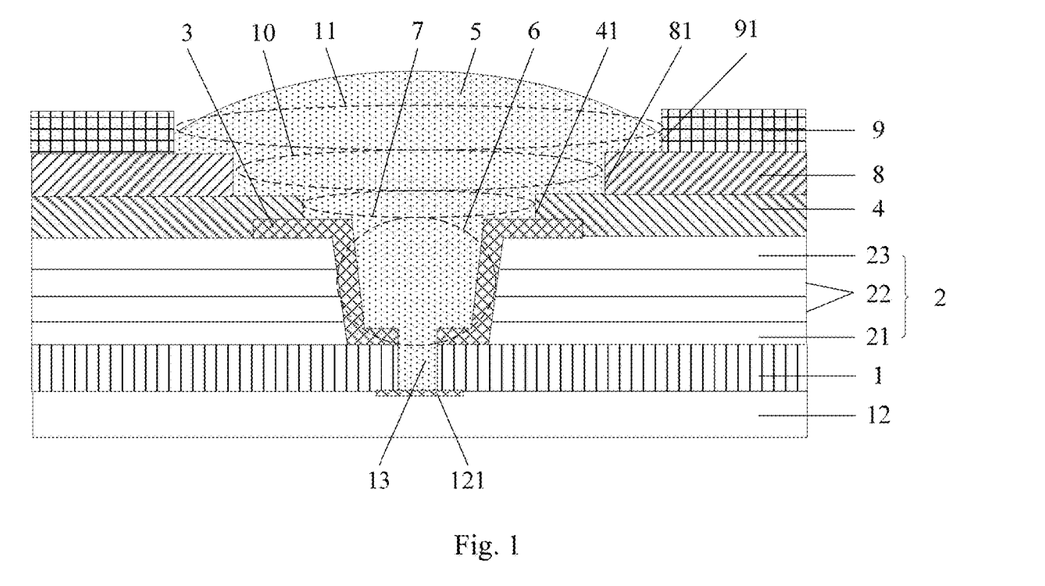
FIG. 1 is a schematically structural view of a periphery area of a display panel provided by an embodiment of the present disclosure.

For example, both the first via-hole 6 and the second via-hole 7 are provided at the periphery area of the OLED display panel, the connection wire 5 is used to electrically connect with a flexible printed circuit (FPC) 12, and the connection wire 5 is, for example, made of a conductive material. For example, the source-drain electrode layer 3 is provided in the same layer as the source electrode and the drain electrode of the thin film transistor array in an active area (AA) region and manufactured at the same time with the source electrode and the drain electrode of the thin film transistor array in the AA region.

In the OLED display panel provided by the embodiment of the present disclosure, the first via-hole 6 is formed in the insulation layer 2, and the source-drain electrode layer 3 overlays the first via-hole 6. The planarization layer 4 is on the insulation layer 2 and the source-drain electrode layer 3. The second via-hole 7 is in the planarization layer 4, and the second via-hole 7 is in communication with the first via-hole 6. The first step 41 made up of the planarization layer 4 and the source-drain electrode layer 3 is at the position of the second via-hole 7. The connection wire 5 is in at least the first via-hole 6 and the second via-hole 7 and overlays at least the first step 41, that is, the connection wire 5 is connected to the planarization layer 4 via the first step 41; in this way, the connection wire 5 is not easy to fall off the via-hole area, and the adhesion between the connection wire 5 and the planarization layer 4 is more firm. As a result, the bonding effect between the OLED display panel and the FPC and the stability of signal transmission are both increased.

Figure 3:
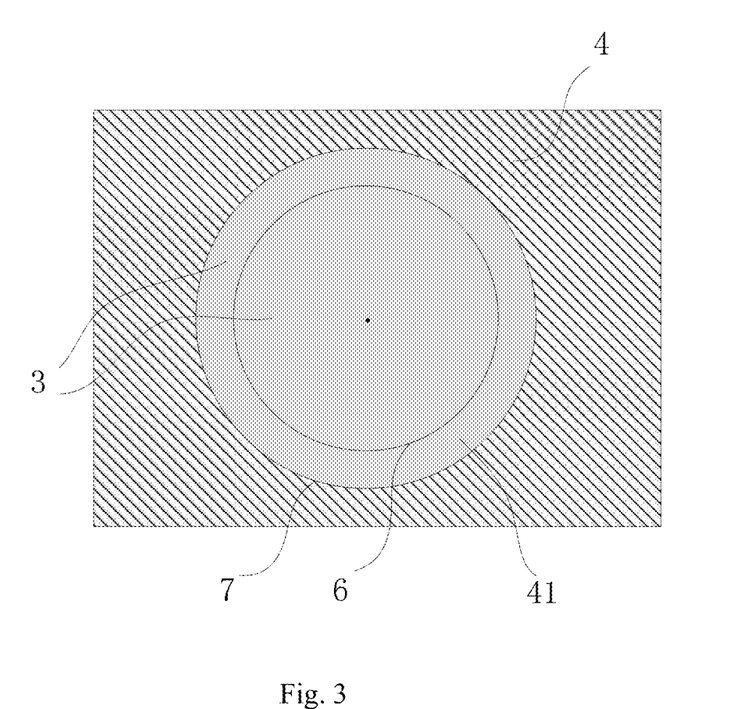
FIG. 3 is an enlarged top view of part of a display panel provided by an embodiment of the present disclosure.

For example, as illustrated in FIG. 3, the first via-hole 6 is exactly provided at the center position of the second via-hole 7 (that is, the first via-hole 6 and the second via-hole 7 are concentric), and therefore, the planarization layer 4 and the source-drain electrode layer 3 form a first step 41 having a closed loop shape along the entire edge of the second via-hole 7. It should be noted that, the second via-hole 7 and the first via-hole 6 may also be non-concentric with each other. For example, the edge of the second via-hole 7 at one side coincides with the edge of the first via-hole 6 at one side in the vertical direction. Because the diameter of the second via-hole 7 is greater than the diameter of the first via-hole 6, the planarization layer 4 and the source-drain electrode layer 3 form the first step 41 at only partial edge of the second via-hole 7, that is, the first step 41 is formed at only partial edge of the second via-hole 7, in this way, the first step 41 does not have a closed loop shape. Although the first step 41 is formed at the partial edge of the second via-hole 7, the firmness of the adhesion between the connection wire 5 and the planarization layer 4 may also be increased to some degree. The "closed loop" in the present disclosure may include regular shapes, such as a square loop, a circular loop, an ellipsoid loop, and so on, and may also include irregular shapes. The embodiments of the present disclosure are described by taking the circular loop as an example.

Figure 2A:
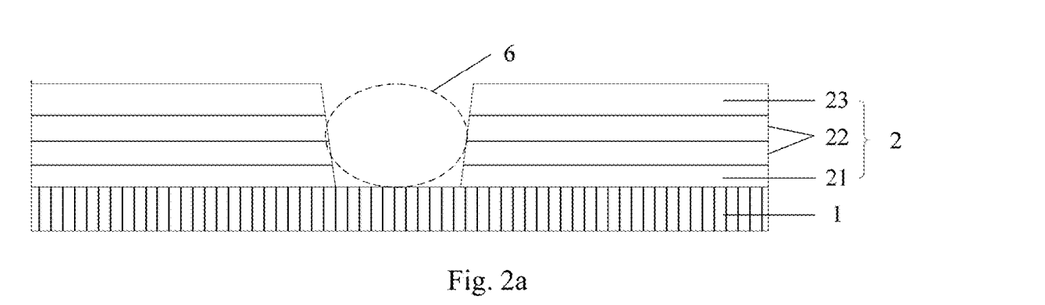
FIG. 2a to FIG. 2g are schematic diagrams of steps in a method for manufacturing a display panel provided by an embodiment of the present disclosure.
Figure 2B:
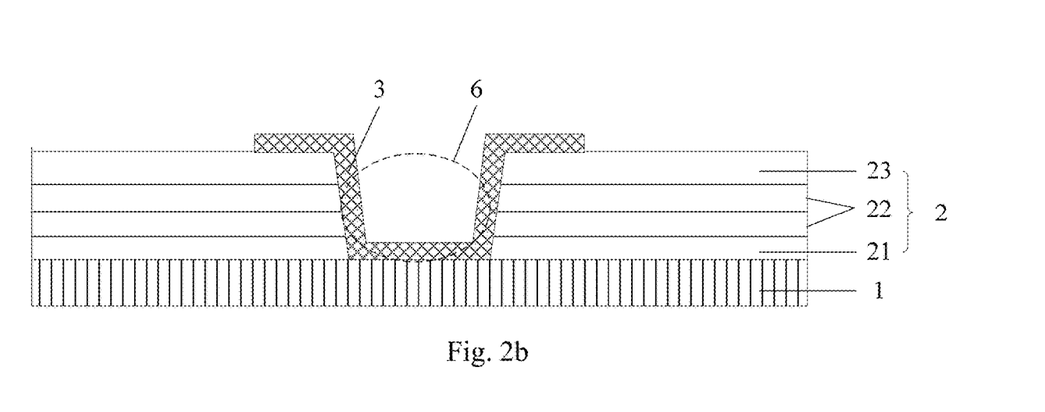
Figure 2C:
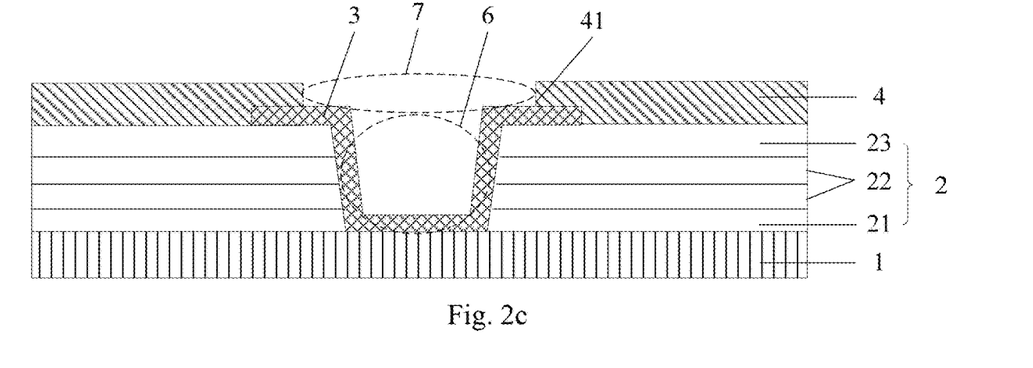
Figure 2D:
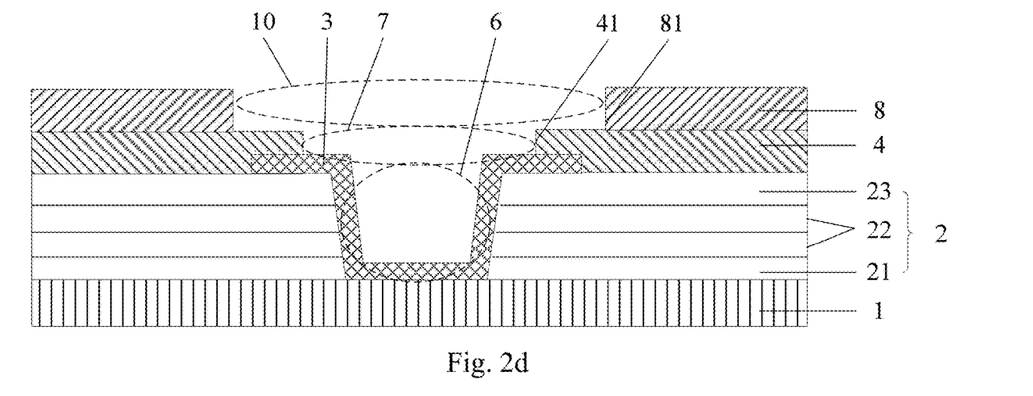

For example, as illustrated in FIG. 1 and FIG. 2d, the OLED display panel further includes a pixel define layer 8 provided on the planarization layer 4, the pixel define layer 8 is used to define pixel units. A third via-hole 10 penetrating through the pixel define layer 8 is provided in the pixel define layer 8 at the position corresponding to the second via-hole 7, and the third via-hole 10 is in communication with the second via-hole 7, that is, the third via-hole 10, the second via-hole 7 and the first via-hole 6 are in communication with one another. The pixel define layer 8 and the planarization layer 4 form a second step 81 at the position of the third via-hole 10, and the connection wire 5 is provided in the third via-hole 10 and further overlays the second step 81.

For example, the first via-hole 6, the second via-hole 7, the third via-hole 10 are concentric, and the diameter of the third via-hole 10 is greater than the diameter of the second via-hole 7. The third via-hole 10, the diameter of which is greater than the diameter of the second via-hole 7, is in the pixel define layer 8, and the third via-hole 10 is in communication with the second via-hole 7 and the first via-hole 6. The pixel define layer 8 and the planarization layer 4 form a closed loop second step 81 at the position of the third via-hole 10. The connection wire 5 is further provided in the third via-hole 10 and overlays the second step 81, that is, the connection wire 5 is connected to the pixel define layer 8 through the second step 81. In this way, the connection wire 5 is not easy to fall off the via-hole area, and the adhesion between the connection wire 5 and the pixel define layer 8 is more firm. As a result, the bonding effect between the OLED display panel and the FPC and the stability of signal transmission are both further increased. As illustrated in FIG. 1, the connection wire 5 continuously overlays at least the first step 41 and the second step 81, and the connection wire 5 is in direct contact with each of the first step 41 and the second step 81.

Figure 2E:
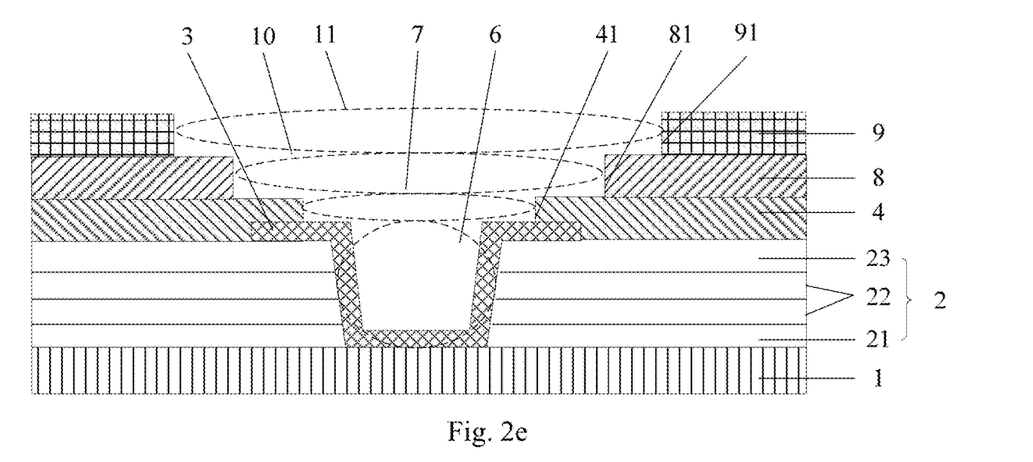

For example, as illustrated in FIG. 1 and FIG. 2e, the OLED display panel further includes a spacer layer (PS) 9 provided on the pixel define layer 8, and the spacer layer 9 is used to support and maintain the cell thickness of the OLED display panel. A fourth via-hole 11 penetrating through the spacer layer 9 is provided in the spacer layer 9 at the position corresponding to the third via-hole 10, and the fourth via-hole 11 is in communication with the third via-hole 10. The spacer layer 9 and the pixel define layer 8 form a third step 91 at the position of the fourth via-hole 11, and the connection wire 5 is provided in the fourth via-hole 11 and overlays the third step 91.

For example, the first via-hole 6, the second via-hole 7, the third via-hole 10 and the fourth via-hole 11 are concentric, and the diameter of the fourth via-hole 11 is greater than the diameter of the third via-hole 10. The fourth via-hole 11, the diameter of which is greater than the diameter of the third via-hole 10, is in the spacer layer 9, and the fourth via-hole 11 is in communication with each of the third via-hole 10, the second via-hole 7 and the first via-hole 6. The spacer layer 9 and the pixel define layer 8 form the third step 91 at the position of the fourth via-hole 11. The connection wire 5 is further provided in the fourth via-hole 11 and overlays the third step 91, that is, the connection wire 5 is connected to the spacer layer 9 through the third step 91. In this way, the connection wire 5 is not easy to fall off the via-hole area, and the adhesion between the connection wire 5 and the spacer layer 9 is more firm. As a result, the bonding effect between the OLED display panel and the FPC and the stability of signal transmission can be further increased. As illustrated in FIG. 1, the connection wire 5 continuously overlays at least the first step 41, the second step 81 and the third step 91, and the connection wire 5 is in direct contact with each of the first step 41, the second step 81 and the third step 91.

For example, as illustrated in FIG. 1, the first step 41, the second step 81 and the third step 91 form a stepped aperture, and the connection wire 5 adheres to the stepped aperture, and thus the firmness and stability can be significantly increased.

For example, the base substrate 1 is a flexible substrate, and the base substrate 1 is provided at the side of the insulation layer 2 away from the planarization layer 4. A through-hole 13 is provided in the source-drain electrode layer 3 and the base substrate 1 at the position corresponding to the bottom of the first via-hole 6, and the through-hole 13 runs through the source-drain electrode layer 3 and the base substrate 1.

For example, the OLED display panel further includes the FPC 12. The FPC 12 is provided at the side of the base substrate 1 away from the insulation layer 2, and a signal line 121 is provided on the FPC 12. The connection wire 5 is connected to the signal line 121 via the through-hole 13, such that a display module and the FPC are bonded to each other.

For example, the region, on which the signal line are not provided, of FPC 12 adheres to the base substrate 1.

For example, the position of the signal line 121 corresponds to the position of the through-hole 13, that is, the signal line 121 is exactly provided at the position of the through-hole 13, or the signal line 121 overlays the through-hole 13. In this way, the connection wire 5 is directly connected to the signal line 121 under the through-hole 13.

It should be noted that, the insulation layer 2 may include a plurality of layers. For example, in an embodiment of the present disclosure illustrated in FIG. 1, the insulation layer 2 includes a buffer layer 21, a gate insulation layer (GI) 22 and an interlayer insulation layer (ILD) 23. The buffer layer 21, the gate insulation layer 22 and the interlayer insulation layer 23 are sequentially provided on the base substrate 1, and the first via-hole 6 runs through each of the buffer layer 21, the gate insulation layer 22 and the interlayer insulation layer 23.

The embodiments of the present disclosure further provide an OLED display device, the OLED display device includes the above-mentioned OLED display panel, and the OLED display device, for example, is a flexible OLED display device.

In the OLED display device provided by the embodiments of the present disclosure, the first via-hole 6 is formed in the insulation layer 2, and the source-drain electrode layer 3 overlays the first via-hole 6. The planarization layer 4 is on the insulation layer 2 and the source-drain electrode layer 3. The second via-hole 7 is in the planarization layer 4, and the second via-hole 7 is in communication with the first via-hole 6. The first step 41 made up of the planarization layer 4 and the source-drain electrode layer 3 is at the position of the second via-hole 7. The connection wire 5 is in at least the first via-hole 6 and the second via-hole 7 and overlays at least the first step 41, that is, the connection wire 5 is connected to the planarization layer 4 via the first step 41; in this way, the connection wire 5 is not easy to fall off the via-hole area, and the adhesion between the connection wire 5 and the planarization layer 4 is more firm. As a result, the bonding effect between the OLED display panel and the FPC and the stability of signal transmission are both increased.

The embodiments of the present disclosure further provide a method for manufacturing an OLED display panel, and the method is used to manufacture the above-mentioned OLED display panel. The method for manufacturing an OLED display panel, comprising: forming a first film layer on a base substrate, and forming a first via-hole penetrating through the first film layer; forming a second film layer on the first film layer, and forming a second via-hole penetrating through the second film layer at a position of the second film layer corresponding to the first via-hole, the second via-hole being in communication with the first via-hole, the second film layer and the first film layer forming a first step at a position of the second via hole; and forming a connection wire at a position corresponding to the second via-hole and the first via-hold and overlying the first step.

In the embodiments of the present disclosure, no specific limitations will be given to the method for fabricating each layer. For example, a film pattern may be formed through a patterning process with respect to a film which is formed by a physical film formation method or a chemical film formation method. The patterning process includes a lithography patterning process, an inkjet printing process, and so on. For example, the lithography patterning process may include the following processes: coating a photoresist layer onto a film to be patterned; performing exposure to the photoresist layer with a mask, developing the photoresist layer after exposure, so as to obtain a photoresist pattern; etching the film with the photoresist pattern as a mask; finally, removing the remaining photoresist to obtain the desired film pattern. Descriptions are given to the following embodiment by taking the lithography patterning process (the patterning process for short) as an example.

As illustrated in FIG. 2a, the method includes: forming the insulation layer 2 on the base substrate 1, and forming the first via-hole 6 penetrating through the insulation layer 2 by a patterning process.

For example, the forming the first film layer on the base substrate, and forming the first via-hole penetrating through the first film layer comprises: forming an insulation layer on the base substrate, and forming the first via-hole penetrating through the insulation layer, For example, the forming the second film layer on the first film layer, and forming the second via-hole penetrating through the second film layer at a position of the second film layer corresponding to the first via-hole comprises: forming a planarization layer on the insulation layer, and forming the second via-hole penetrating through the planarization layer at a position of the planarization layer corresponding to the first via-hole, the second film layer and the first film layer forming the first step at a position of the second via-hole;

For example, the method further comprises: forming a source-drain electrode layer between the insulation layer and the planarization layer, the source drain electrode layer overlays the first via-hole, the planarization layer and the source-drain electrode layer form the first step at a position of the second via-hole;

For example, a photoresist layer is coated onto the insulation layer 2, and the first via-hole 6 penetrating through the insulation layer 2 is obtained through performing exposure with a mask, development and etching to the base substrate 1 which has gone through the above-mentioned steps.

For example, the insulation layer 2 includes a buffer layer 21, a gate insulation layer (GI) 22 and an interlayer insulation layer (ILD) 23. The buffer layer 21, the gate insulation layer 22 and the interlayer insulation layer 23 are sequentially formed on the base substrate 1, and the first via-hole 6 runs through each of the buffer layer 21, the gate insulation layer 22 and the interlayer insulation layer 23.

As illustrated in FIG. 2b, the method further includes: forming a pattern of the source-drain electrode layer 3 at the first via-hole region of the insulation layer 2 by a patterning process.

For example, depositing a metal film for forming the source-drain electrode at a first via-hole region of the insulation layer 2, coating a photoresist layer onto the metal film for forming the source-drain electrode, and forming the pattern of the source-drain electrode layer 3 at the first via-hole region of the insulation layer 2 through performing exposure with a mask, development and etching to the base substrate 1 which has gone through the above-mentioned steps. It should be noted that, the pattern of the source-drain electrode layer 3 may be manufactured at the same time with the source electrode pattern and the drain electrode pattern of the thin film transistor array in the AA region, and therefore no additional patterning step is needed.

As illustrated in FIG. 2c, the method further includes: forming the planarization layer 4, and forming the second via-hole 7 penetrating through the planarization layer 4 in the planarization layer 4 at the position corresponding to the first via-hole 6 by a patterning process, and the second via-hole 7 is in communication with the first via-hole 6. For example, the diameter of the second via-hole 7 is greater than the diameter of the first via-hole 6. The planarization layer 4 and the source-drain electrode layer 3 form the first step 41 at the position of the second via-hole 7.

As illustrated in FIG. 2d, the method further includes: forming the pixel define layer 8, and forming the third via-hole 10 penetrating through the pixel define layer 8 in the pixel define layer 8 at the position corresponding to the second via-hole 7 by a patterning process, and the third via-hole 10 is in communication with the second via-hole 7. For example, the diameter of the third via-hole 10 is greater than the diameter of the second via-hole 7. The pixel define layer 8 and the planarization layer 4 form the second step 81 at the position of the third via-hole 10.

As illustrated in FIG. 2e, the method further includes: forming the spacer layer 9, and forming the fourth via-hole 11 penetrating through the spacer layer 9 in the spacer layer 9 at the position corresponding to the third via-hole 10 by a patterning process, the fourth via-hole 11 is in communication with the third via-hole 10. The diameter of the fourth via-hole 11 is greater than the diameter of the third via-hole 10. The spacer layer 9 and the pixel define layer 8 form the third step 91 at the position of the fourth via-hole 11.

Figure 2F:
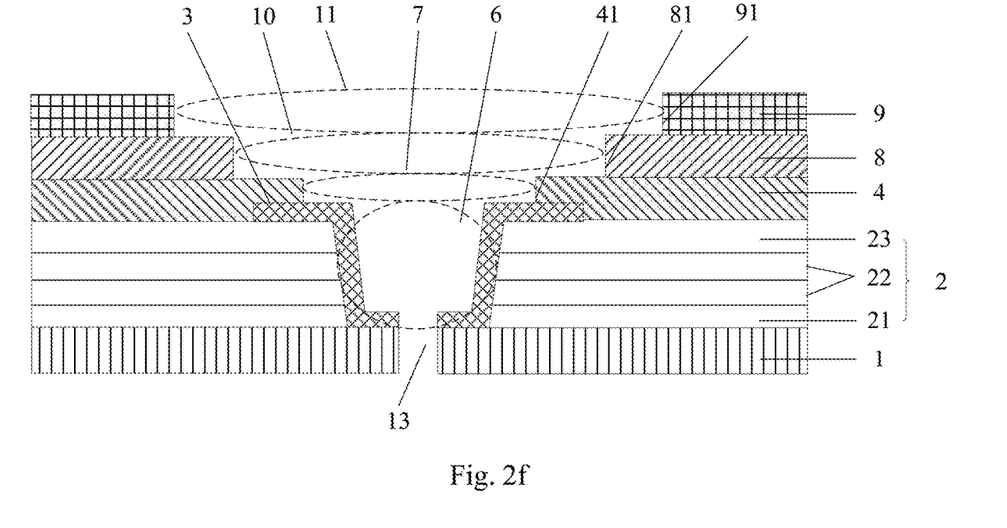

As illustrated in FIG. 2f, forming the through-hole 13 penetrating through the source-drain electrode layer 3 and the base substrate 1 in the base substrate 1 and the source-drain electrode layer 3 at the position corresponding to the bottom of the first via-hole 6. For example, the base substrate 1 is a flexible substrate.

For example, the through-hole 13 penetrating through both the source-drain electrode layer 3 and the base substrate 1 may be formed, in the base substrate 1 and the source-drain electrode layer 3 at the position corresponding to the bottom of the first via-hole 6, by using laser.

Figure 2G:
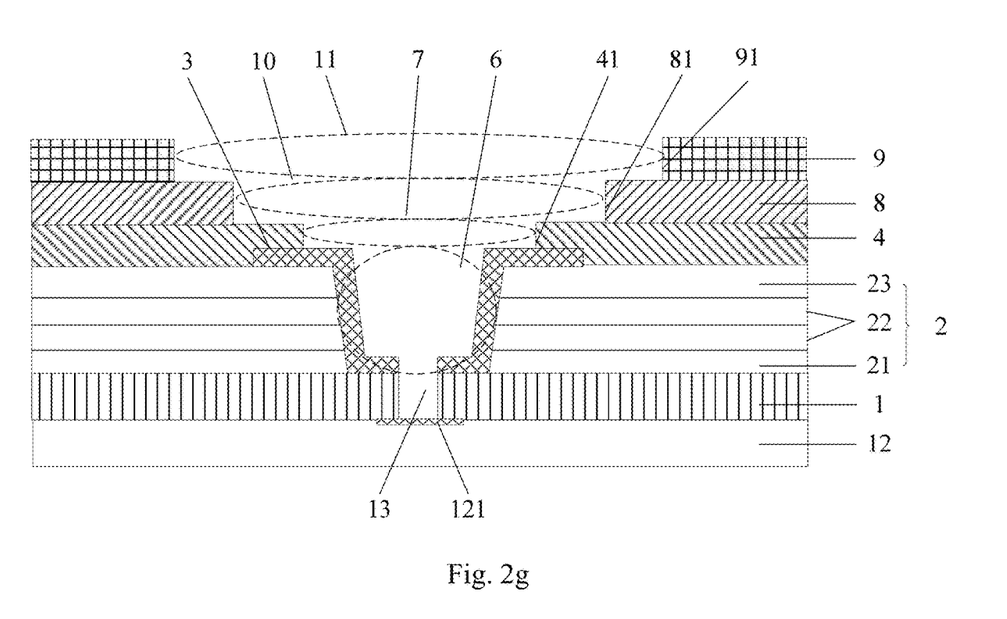

As illustrated in FIG. 2g, the method further includes: adhering the FPC 12 with the base substrate 1, so as to allow the signal line 121 provided on the FPC 12 to correspond to the through-hole 13.

As illustrated in FIG. 1, the method further includes: forming the pattern of the connection wire 5 at the position corresponding to the first via-hole 6, the second via-hole 7, the third via-hole 10 and the fourth via-hole 11 by a patterning process, so as to allow the connection wire 5 to overlay the third step 91, the second step 81 and the first step 41, and to allow the connection wire 5 to be in connection with the signal line 121 on the FPC 12 via the through-hole 13.

It should be noted that, the first step 41, the second step 81 and the third step 91 may also be formed by half-tone mask technology with a halftone mask, and in this case, the number of the patterning processes can be reduced by two correspondingly.

If the OLED display panel includes only the first step 41, and does not include the second step 81 and the third step 91, the connection wire 5 overlays the first step 41. If the OLED display panel includes only the first step 41 and the second step 81, and does not include the third step 91, the connection wire 5 overlays the first step 41 and the second step 81.

In the method for manufacturing an OLED display panel, the first via-hole 6 is formed in the insulation layer 2, and the source-drain electrode layer 3 overlays the first via-hole 6. The planarization layer 4 is on the insulation layer 2 and the source-drain electrode layer 3. The second via-hole 7 is in the planarization layer 4, and the second via-hole 7 is in communication with the first via-hole 6. The first step 41 made up of the planarization layer 4 and the source-drain electrode layer 3 is at the position of the second via-hole 7. The connection wire 5 is in at least the first via-hole 6 and the second via-hole 7 and overlays at least the first step 41, that is, the connection wire 5 is connected to the planarization layer 4 via the first step 41; in this way, the connection wire 5 is not easy to fall off the via-hole area, and the adhesion between the connection wire 5 and the planarization layer 4 is more firm. As a result, the bonding effect between the OLED display panel and the FPC and the stability of signal transmission are both increased. The manufacturing processes for the OLED display panel is simple, the above-mentioned layers of the OLED display panel can be manufactured at the same time with corresponding film structures of the thin film transistor array in the AA region, and therefore no additional manufacturing process is needed.

In the present disclosure, the following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or area may be enlarged or narrowed, that is, the drawings are not drawn in a real scale.

(3) In case of no conflict, features in one embodiment or in different embodiments can be combined to obtain new embodiments.

What is described above is related to the illustrative embodiments of the disclosure only and not limitative to the scope of the disclosure; the scopes of the disclosure are defined by the accompanying claims.

What is claimed is:

1. An OLED display panel comprising:
    a base substrate,
    a first film layer and a second film layer, sequentially provided on the base substrate, a first via-hole penetrating through the first film layer being provided in the first film layer, a second via-hole penetrating through the second film layer being provided in the second film layer at a position corresponding to the first via-hole, the second via-hole being in communication with the first via-hole, and the first film layer and the second film layer forming a first step at a position of the second via-hole; and
    a connection wire, provided in both the first via-hole and the second via-hole and overlying the first step,
    wherein the first film layer is an insulation layer, the second film layer is an planarization layer,
    wherein the OLED display panel further comprises: a source-drain electrode layer between the insulation layer and the planarization layer, the source-drain electrode layer overlays the first via-hole, the planarization layer and the source-drain electrode layer form the first step at a position of the second via-hole.

2. The OLED display panel according to claim 1, wherein the base substrate is a flexible substrate provided at a side of the insulation layer away from the planarization layer; a through-hole penetrating through both the source-drain electrode layer and the base substrate is provided in the source-drain electrode layer and the base substrate at a position corresponding to a bottom of the first via-hole.

3. The OLED display panel according to claim 2, further comprising a flexible printed circuit board, wherein the flexible printed circuit board is provided at a side of the base substrate away from the insulation layer; and the connection wire is connected to a signal line on the flexible printed circuit board via the through-hole.

4. The OLED display panel according to claim 3, wherein a region, on which the signal line are not provided, of the flexible printed circuit board is adhered to the base substrate.

5. An OLED display device, comprising the OLED display panel according to claim 1.

6. The OLED display panel according to claim 1, further comprising a pixel define layer provided on the planarization layer, wherein a third via-hole penetrating through the pixel define layer is provided in the pixel define layer at a position corresponding to the second via-hole, the third via-hole is in communication with the second via-hole; the pixel define layer and the planarization layer form a second step at a position of the third via-hole and the connection wire is further provided in the third via-hole, and further overlays the second step.

7. The OLED display panel according to claim 6, further comprising a spacer layer provided on the pixel define layer, wherein a fourth via-hole penetrating through the spacer layer is provided in the spacer layer at a position corresponding to the third via-hole, the fourth via-hole is in communication with the third via-hole; the spacer layer and the pixel define layer form a third step at a position of the fourth via-hole, and the connection wire is further provided in the fourth via-hole and further overlays the third step.

8. The OLED display panel according to claim 7, wherein the first via-hole, the second via-hole, the third via-hole, and the fourth via-hole are concentric, and a diameter of the fourth via-hole is greater than a diameter of the third via-hole.

9. The OLED display panel according to claim 6, wherein the first via-hole, the second via-hole, and the third via-hole are concentric, and a diameter of the third via-hole is greater than a diameter of a second via-hole.

10. The OLED display panel according to claim 1, wherein the insulation layer comprises a buffer layer, a gate insulation layer and an interlayer insulation layer; the buffer layer, the gate insulation layer and the interlayer insulation layer are sequentially provided on the base substrate, and the first via-hole runs through each of the buffer layer, the gate insulation layer and the interlayer insulation layer.

11. The OLED display panel according to claim 1, wherein the first via-hole and the second via-hole are concentric, and a diameter of the second via-hole is greater than a diameter of the first via-hole, and the source-drain electrode layer overlays an interface between the first via-hole and the second via-hole.

12. A method for manufacturing an OLED display panel, comprising:
    forming a first film layer on a base substrate, and forming a first via-hole penetrating through the first film layer;
    forming a second film layer on the first film layer, and forming a second via-hole penetrating through the second film layer at a position of the second film layer corresponding to the first via-hole, the second via-hole being in communication with the first via-hole, the second film layer and the first film layer forming a first step at a position of the second via-hole; and
    forming a connection wire at a position corresponding to the second via-hole and the first via-hole, the connection wire being in both the first via-hole and the second via-hole and overlying the first step,
    wherein forming the first film layer on the base substrate, and forming the first via-hole penetrating through the first film layer comprises: forming an insulation layer on the base substrate, and forming the first via-hole penetrating through the insulation layer;
    wherein forming the second film layer on the first film layer, and forming the second via-hole penetrating through the second film layer at a position of the second film layer corresponding to the first via-hole comprises: forming a planarization layer on the insulation layer, and forming the second via-hole penetrating through the planarization layer at a position of the planarization layer corresponding to the first via-hole, the second film layer and the first film layer forming the first step at a position of the second via-hole;
    wherein the method further comprises: forming a source-drain electrode layer between the insulation layer and the planarization layer, the source-drain electrode layer overlays the first via-hole, the planarization layer and the source-drain electrode layer form the first step at a position of the second via-hole.

13. The method according to claim 12, wherein after the second via-hole penetrating through the planarization layer is formed at the position of the planarization layer corresponding to the first via-hole, and before forming the connection wire at the position corresponding to the first via-hole and the second via-hole, the method further comprises:
    forming a pixel define layer, and forming a third via-hole penetrating through the pixel define layer at a position of the pixel define layer corresponding to the second via-hole, wherein the third via-hole is in communication with the second via-hole, the pixel define layer and the planarization layer form a second step at a position of the third via-hole.

14. The method according to claim 13, wherein forming the connection wire at the position corresponding to the second via-hole and the first via-hole comprises:
    forming the connection wire at a position corresponding to the first via-hole, the second via-hole and the third via-hole, so as to allow the connection wire to further overlay the second step.

15. The method according to claim 14, wherein after the third via-hole penetrating through the pixel define layer is formed in the pixel define layer at the position corresponding to the second via-hole, and before forming the connection wire at the position corresponding to the first via-hole, the second via-hole and the third via-hole, the method further comprises:
    forming a spacer layer, and forming a fourth via-hole penetrating through the spacer layer at a position of the spacer layer corresponding to the third via-hole, wherein the fourth via-hole is in communication with the third via-hole, the spacer layer and the pixel define layer form a third step at a position of the fourth via-hole.

16. The method according to claim 15, wherein forming the connection wire at the position corresponding to the first via-hole, the second via-hole and the third via-hole comprises:
    forming the connection wire at a position corresponding to the first via-hole, the second via-hole, the third via-hole and the fourth via-hole, so as to allow the connection wire to further overlay the third step.

17. The method according to claim 16, wherein before forming the connection wire at the position corresponding to the first via-hole, the second via-hole, the third via-hole and the fourth via-hole, so as to allow the connection wire to further overlay the third step, the method further comprises:
    forming a through-hole penetrating through both the source-drain electrode layer and the base substrate at a position of the base substrate and the source-drain electrode layer corresponding to a bottom of the first via-hole; and
    adhering a flexible printed circuit board to the base substrate, so as to allow a signal line provided on the flexible printed circuit board to correspond to the through-hole.

18. The method according to claim 17, wherein the connection wire overlays the first step, the second step, and the third step, the connection wire is connected to the signal line on the flexible printed circuit board via the through-hole.

* * * * *